United States Patent
Fujita et al.

(10) Patent No.: US 9,392,707 B2
(45) Date of Patent: Jul. 12, 2016

(54) DISPLAY DEVICE

(71) Applicant: NIPPON SEIKI CO., LTD., Niigata (JP)

(72) Inventors: Yutaka Fujita, Niigata (JP); Yusuke Okaji, Niigata (JP)

(73) Assignee: NIPPON SEIKI CO., LTD., Niigata (JP)

( * ) Notice: Subject to any disclaimer, the term of this patent is extended or adjusted under 35 U.S.C. 154(b) by 55 days.

(21) Appl. No.: 14/378,855

(22) PCT Filed: Feb. 6, 2013

(86) PCT No.: PCT/JP2013/052645
§ 371 (c)(1),
(2) Date: Aug. 14, 2014

(87) PCT Pub. No.: WO2013/121937
PCT Pub. Date: Aug. 22, 2013

(65) Prior Publication Data
US 2015/0029688 A1 Jan. 29, 2015

(30) Foreign Application Priority Data

Feb. 15, 2012 (JP) ................................. 2012-030907

(51) Int. Cl.
*H05K 7/20* (2006.01)
*H05K 5/00* (2006.01)
(Continued)

(52) U.S. Cl.
CPC ........ *H05K 5/0017* (2013.01); *G02F 1/133308* (2013.01); *H05K 7/142* (2013.01);
(Continued)

(58) Field of Classification Search
CPC ............... H05K 5/0017–5/006; H05K 5/0043; H05K 5/0047; H05K 5/0052; H05K 9/0016; H05K 9/0026; H05K 9/0032
See application file for complete search history.

(56) References Cited

U.S. PATENT DOCUMENTS 5,675,396 A * 10/1997 Tsunehiro ........... G02F 1/13452
349/149
5,808,707 A * 9/1998 Niibori ............. G02F 1/133308
349/150
(Continued)

FOREIGN PATENT DOCUMENTS

JP  5-188388 A  7/1993
JP  2000-147545 A  5/2000
(Continued)

OTHER PUBLICATIONS

International Search Report PCT/JP2013/052645 dated May 14, 2013.
(Continued)

*Primary Examiner* — Anthony Q Edwards
(74) *Attorney, Agent, or Firm* — McDermott Will & Emery LLP

(57) ABSTRACT

Provided is a display device that is exceptionally easy to assemble. A display device includes an electroconductive housing. A case body accommodates the display device. A connecting member causes electrification between the housing of the display device and a grounding part of a circuit substrate. The connecting member has a base part that contacts the housing, and an elastic contact armature that contacts the grounding part of the circuit substrate when the circuit substrate is secured to the case body. A securing member secures the display device to the case body so that the base part is held between the housing and the case body. The case body has an elastic locking armature for securing the circuit substrate. The case body has a through-hole through which the elastic contact armature of the connecting member is inserted.

5 Claims, 5 Drawing Sheets

(51) Int. Cl.
*H05K 7/14* (2006.01)
*H05K 9/00* (2006.01)
*G02F 1/1333* (2006.01)

(52) U.S. Cl.
CPC ... *H05K 9/0067* (2013.01); *G02F 2001/13332* (2013.01); *G02F 2001/133314* (2013.01); *G02F 2201/465* (2013.01); *G02F 2202/22* (2013.01)

(56) References Cited

U.S. PATENT DOCUMENTS

| | | | | |
|---|---|---|---|---|
| 6,049,469 | A * | 4/2000 | Hood, III | G06F 1/182 174/388 |
| 6,222,597 | B1 * | 4/2001 | Muramatsu | G02F 1/13308 349/58 |
| 6,358,065 | B1 | 3/2002 | Terao et al. | |
| 6,490,016 | B1 | 12/2002 | Koura | |
| 7,304,854 | B2 * | 12/2007 | Tseng | H01L 23/3672 165/185 |
| 7,537,962 | B2 * | 5/2009 | Jang | H01L 23/3128 257/686 |
| 7,722,398 | B2 * | 5/2010 | Ma | H01R 12/592 439/493 |
| 8,199,528 | B2 * | 6/2012 | Tachikawa | H05K 7/142 174/350 |
| 8,520,405 | B2 * | 8/2013 | Yukiyoshi | H04N 5/64 361/799 |
| 2006/0110949 | A1 | 5/2006 | Jee et al. | |
| 2012/0194491 | A1 * | 8/2012 | Ryuh | G02F 1/13452 345/206 |
| 2014/0104538 | A1 * | 4/2014 | Park | G02F 1/133608 349/60 |

FOREIGN PATENT DOCUMENTS

| | | |
|---|---|---|
| JP | 2001-75485 A | 3/2001 |
| JP | 2005-209868 A | 8/2005 |
| JP | 2006-67317 A | 3/2006 |
| JP | 2009-237220 A | 10/2009 |
| WO | 2008/010280 A1 | 1/2008 |

OTHER PUBLICATIONS

Supplemental European Search Report dated Feb. 8, 2016 issued in European Patent Application No. 13749298.

* cited by examiner

DISPLAY DEVICE

CROSS-REFERENCE TO RELATED APPLICATIONS

This application is the U.S. National Phase of PCT/JP2013/052645 filed Feb. 6, 2013, which claims priority from Japanese Patent Application No. 2012-030907 filed Feb. 15, 2012. The subject matter of each is incorporated by reference in entirety.

TECHNICAL FIELD

The present invention relates to a display device that prevents a display from taking an electrical charge.

BACKGROUND ART

Conventionally, a liquid crystal display device has a rectangular shape metal frame, and several claw portions formed at the metal frame are inserted into holes formed at a circuit board. Each claw portions are bent so that the metal frame is connected to a ground pattern, and the liquid crystal display device is fixed by the metal frame.

CITATION LIST

Patent Literature

Patent Literature 1: Japanese Unexamined Patent Application Publication No. 5-188388

SUMMARY OF INVENTION

Technical Problem

An object of the present invention is to provide a display device excellent in assembling.

Solution to Problem

The first feature of the present invention is that a display device comprising: a display configured to have a conductive box case; a case configured to accommodate the display; and a connecting member configured to conduct the box case of the display and a ground of a circuit board; wherein the connecting member consisting an elastic contact armature, and the elastic contact armature configured to contact with the ground of a circuit board upon the circuit board is fixed to the case.

The second feature of the present invention is that a display device comprising: a display configured to have a conductive box case; a case configured to accommodate the display; and a connecting member configured to conduct the box case of the display and a ground of a circuit board, a static electricity is discharged from the display to the circuit board; wherein the connecting member consisting a base configured to contact with the box case and an elastic contact armature configured to contact with the ground of a circuit board upon the circuit board is fixed to the case, and a fix member fixing the display to the case as the base is to be sandwiched between the box case and the case.

The third feature of the present invention is that the case further comprising an elastic locking armature configured to fix the circuit board.

The fourth feature of the present invention is that the base further comprising a concave configured to dispose the base of the connecting member.

The fifth feature of the present invention is that the case further comprising a through hole configured to insert the elastic contact armature of the connecting member.

The sixth feature of the present invention is that the case further comprising a positioning member configured to position the circuit board.

The seventh feature of the present invention is that the case further comprising a bottom wall configured to fix the display and a height of the elastic armature projecting from the back of the bottom wall is shorter than a height of the positioning member while the circuit board is not fixed to the case.

Advantageous Effects of Invention

As described above, according to the present invention, a display device configures to be excellent in assembling a case to circuit board and conducting a box case to a ground of the circuit board.

DESCRIPTION OF EMBODIMENTS

Figure 1:
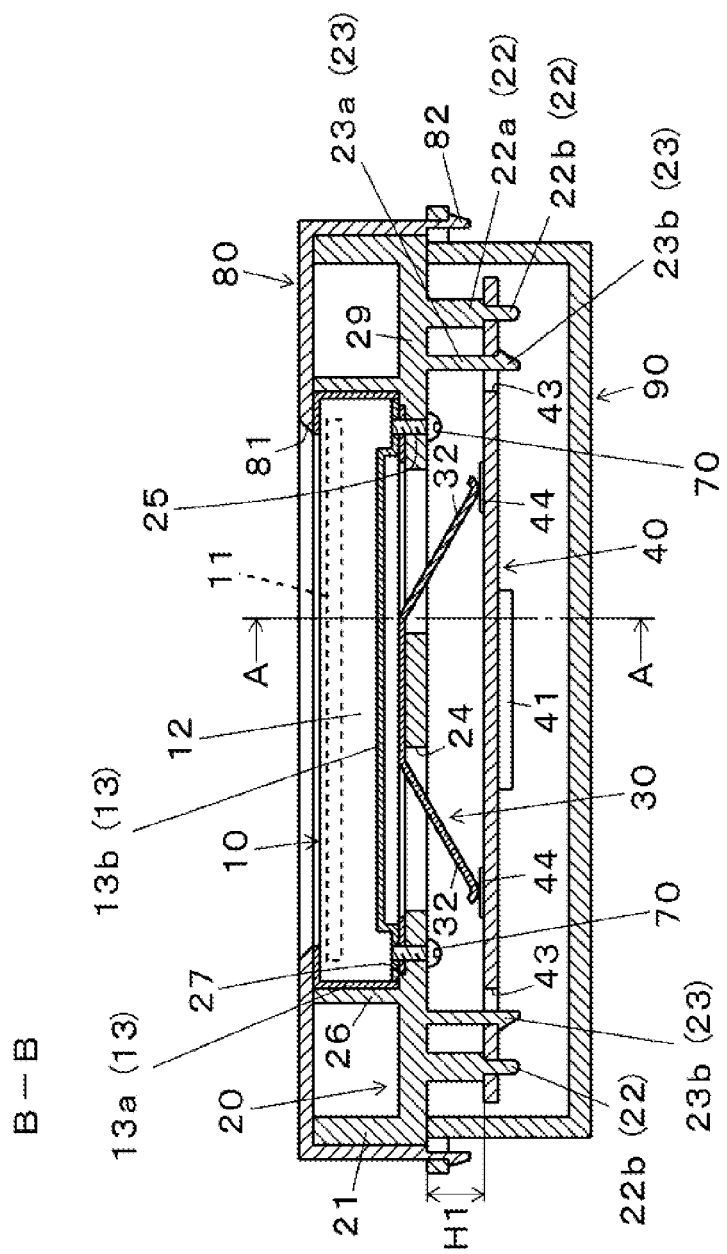
FIG. 1 is a cross-sectional view of a display device according to a first embodiment of the present invention.
Figure 2:
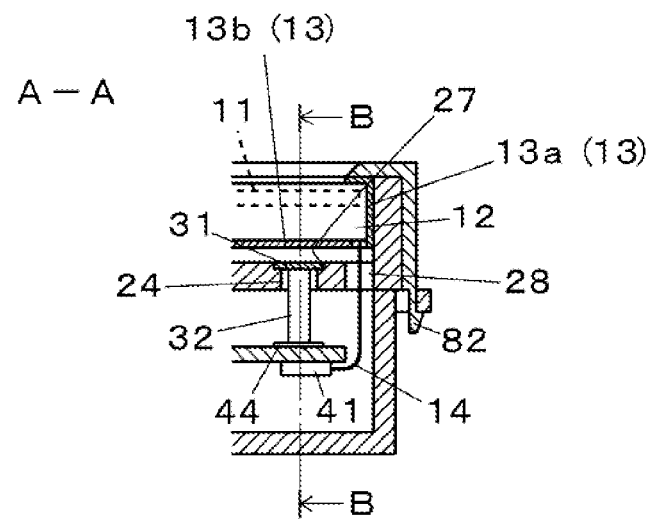
FIG. 2 is a cross-sectional view of a main part of a display device according to a first embodiment of the present invention.
Figure 3:
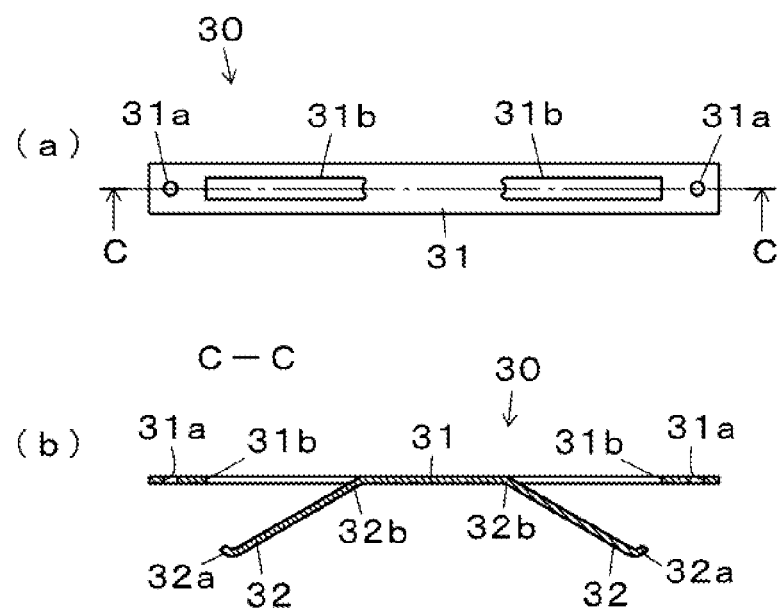
FIG. 3 is a top and cross-sectional view of a connecting member according to a first embodiment of the present invention.
Figure 4:
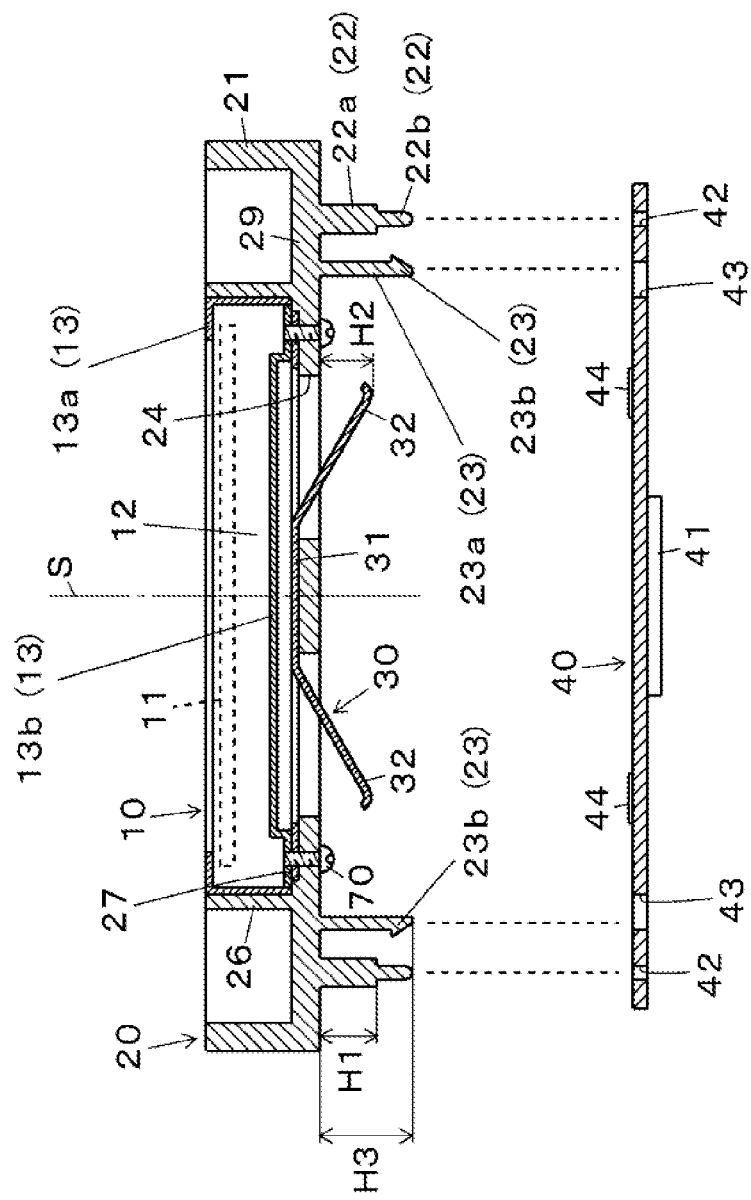
FIG. 4 is a cross-sectional view of a display device according to a first embodiment of the present invention.

With reference to attached drawings FIG. 1 to FIG. 5, a first embodiment of the invention will be described below with an example of a cluster for a motor vehicle comprising a liquid crystal display 10, a case 20, a connecting member 30, a circuit board 40, a front cover 80, and a rear cover 90.

The liquid crystal display 10 comprises a liquid crystal panel 11, a housing 12, a box case 13, and a flexible electric wiring member 14. The liquid crystal panel 11 is a liquid-crystal display formed of a thin film transistor (TFT) and a liquid crystal cell that polarizers are affixed to both side of the cell. The liquid crystal is insulated into the pair of transparent panel which the transistor is embedded. The liquid crystal panel 11 is illuminated by a light which is store in the housing or a back light which has a light guiding member. A light diffusion member may be placed at the back side of a liquid crystal panel 11.

The housing 12 of the liquid crystal display 10 is formed of a white resin, and the liquid crystal display panel 11 and the back light are stored. The box case 13 of the liquid crystal display 10 is formed of a conductive material such as metal, and comprises a front box case 13a and a rear box case 13b. The front box case 13a is formed to have an opening corresponding to the display of the liquid crystal display panel 11 in of a rectangle shape. The front box case 13a is fixed to the rear box case 13b with a hook (not shown), and the front box case 13a and the rear box case 13b are connected to each other to have electrical conductivity.

A flexible electric wiring member 14 is consisted of a flexible base film with designated pattern so as to be called a FPC. A distal part of the flexible electric wiring member 14 is connected to the liquid crystal display panel 11 and an illumination device, and the other distal part is connected to a connector 41 of the circuit board 40. The liquid crystal display 10 is provided electric power form the circuit board 40 through the flexible electric wiring member 14, and input a designated data from an input control unit mounted on the circuit board 40, and displays remaining fuel amount and travel distance on the display of the liquid crystal display panel 11.

A case 20 is formed of white resin and having the liquid crystal display 10 in a space formed with a side wall 21 and a bottom wall 29. The liquid crystal display 10 is fixed to the front side of the bottom wall 29. The bottom wall 29 of the case 20 has a rectangular shape hole that the elastic contact armature of the connecting member 30 passes thought, and a round shape hole that the screw 70 passes though and a rectangular shape hole that the flexible electric wiring member 14 passes though. The base 31 of the connecting member 30 is placed inside of a concave portion 27 which is a part of the bottom wall 29.

The case 20 is provided with the positioning member 22, the elastic locking armature 23, and the wall portion 26 to abut the side of the liquid crystal display 10. The positioning member 22 and elastic locking armature 23 are provided at the back of the bottom wall 29, and have designated height H3.

The positioning member 22 of the case 20 has a base 22a and projection part 22b. The base 22a of the positioning member 22 forms columnar and the height of the base 22a is equal to the height of designated height described later. The projection part 22b of the positioning member 22 is projecting from the base 22a and inserted into a hole 42 of the circuit board 40.

The elastic locking armature 23 of the case 20 is provided with the base 23a and a locking hook 23b. The base 23a of the elastic locking armature 23 is rod-shaped and rectangular section, and the height of the base 23a that will be described later is a sum of a designated height H1 and a thickness of the circuit board 40. The base 23a of the elastic locking armature 23 is inserted into a hole 43 of the circuit board 40 and the circuit board 40 is hooked to the locking hook 23b of the elastic locking armature 23. The circuit board 40 is fixed to the case 20 with the locking hook 23b of the elastic locking armature 23 with the designated height H1 from the bottom wall 29. The designated height H1 is a total height of the back of the bottom wall 29 to the front of the circuit board 40.

A connecting member 30 is formed by pressing and cutting a thin conductive board. The connecting member 30 includes a base 31 and two elastic contact armatures 32. The base 31 of the connecting member 30 includes two round shape holes 31a which the screws 70 are inserted and two rectangular shape holes 31b which are produced when the connecting member 30 is pressed. Both round shape holes 31a and rectangular shape holes 31b are located in where they are bilateral symmetry.

The base 31 of the connecting member 30 is placed in the concave portion 27 and sandwiched between the rear box case 13b of the liquid crystal display 10 and the bottom wall 29 of the case 20. Together with the liquid crystal display 10, the connecting member 30 is fixed to the bottom wall 29 of the case 20 with two screws 70. The connecting member 30 is fixed to the case 20 so that the elastic locking armatures 23 are bilateral symmetry with a central line S as an axis. The base 31 of the connecting member 30 attaches to rear box case 13b nearby the round shape holes 31a.

The distal portion 32a of the elastic contact armatures 32 is curved to attached the ground pattern 44 of the circuit board 40. The other distal portion 32b of the elastic contact armatures 32 are situated sequentially to the base 31. The two elastic contact armatures 32 are bilateral symmetry. The elastic contact armatures 32 of the connecting member 30 are inserted into a hole 24 of the case 20 and project the designated height H2 from the bake surface of the bottom wall 29 before the circuit board 40 is fixed to the case 20 (see FIG. 4).

The designated height H2 is slightly taller than the designated height H1 and slightly shorter than the designated height H3. When the circuit board 40 is fixed with the elastic locking armature 23 to the liquid crystal display 10 and the connecting member 30, the distal portion 32a of the elastic contact armatures 32 of the connecting member 30 is pressed, and the elastic locking armature 23 is bent at the other distal portion 32b.

The circuit board 40 is formed of glass reinforced plastics with copper tracks in the place of wires. The connector 41 is mounted on the back of the circuit board 40 so that the other distal portion of a flexible electric wiring member 14 can be connected. The flexible print wiring member 14 is inserted into the hole 28 of the case 20, and the distal part is connected to the liquid crystal display 10 and the other distal part is connected to the circuit board through the connector 41.

The circuit board 40 includes a round shape hole 42 corresponds to the positioning member 22 and a rectangular shape hole 43 corresponds to the elastic locking armatures 23 of the case 20. The projection part 22b of the positioning part 22 is inserted into the hole 42 of the circuit board 40. The elastic locking armatures 23 is locked to the hole 42 of the circuit board 40. A ground pattern 44 is mounted on the surface of the circuit board 40. Although the ground pattern 44 of the circuit board 40 is made of a soldering layer in this embodiment, the soldering layer is not necessary to be placed. The distal portion 32a of the elastic contact armatures 32 attaches to the ground pattern 44 of the circuit board 40.

The circuit board 40 is fixed by the elastic locking armature 23 to the case 20 which the liquid crystal display 10 and the connecting member 30 are fixed, and the elastic contact armatures 32 of the connecting member 30 are electrically connected to the ground pattern 44 of the circuit board 40. When the circuit board 40 is fixed to the case 20, the elastic locking armature 23 is deformed elastically and the distal portion 32a of the elastic locking armature 23 is pressed to the ground pattern 44 of the circuit board 40. With the connecting member 30, the box case 13 of the liquid crystal display 10 and the ground pattern 44 of the circuit board 40 are electrically connected.

A front cover 80 is formed of opaque resin, and consists of a rectangular shape opening 81 corresponding to the display of the liquid crystal display 10. The front cover 80 is fixed to a back cover 90 with an elastic locking armature 82. The back cover 90 is formed of opaque resin, and covers the back of the circuit board 40. The back cover 90 is fixed to the case 20 with the screws which are not shown in this embodiment.

Figure 6:
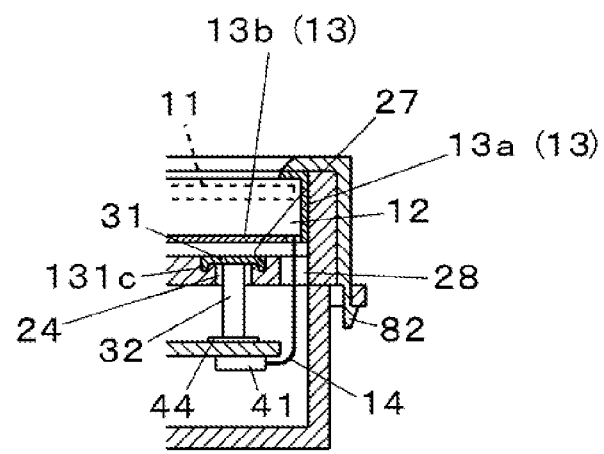
FIG. 6 is a cross-sectional view of a main part of a display device according to a second embodiment of the present invention.
Figure 7:
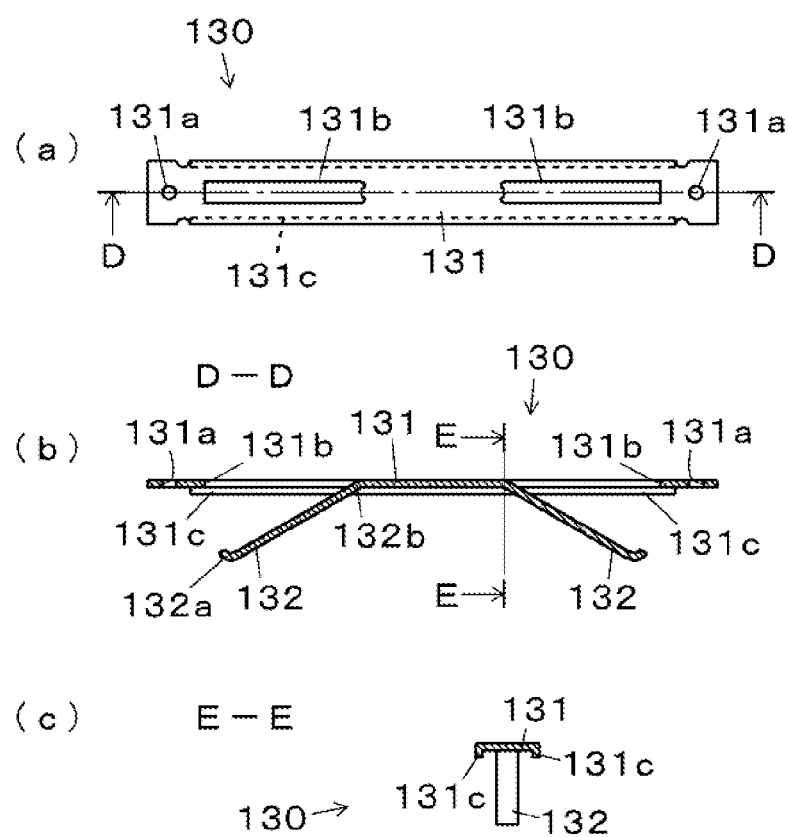
FIG. 7 is a top and cross-sectional view of a connecting member according to a first embodiment of the present invention.

With reference to attached drawings FIG. 6 and FIG. 7, a second embodiment of the invention will be described below with an example of a cluster for a motor vehicle comprising the liquid crystal display 10, the case 20, the connecting member 30, the circuit board 40, the front cover 80, the rear cover 90 and a flange portion 131c provided at a base 131 of a connecting member 130.

A connecting member 130 is provided by pressing and cutting a thin conductive board. The connecting member 130 includes a base 131 and two elastic contact armatures 132. The connecting member 130 is fixed to the case 20 with the screw 70 so that the base 131 is sandwiched between the box case 13 of the liquid crystal display 10 and the case 20. The base 131 of the connecting member 130 includes a round shape hole 131a which the screws 70 are inserted, a rectangular shape holes 131b which was opened when the connecting member 130 was pressed and cut, and a flange portion 131c. A distal portion 132a of the elastic contact armatures 132 is curved to come in contact with the ground pattern 44 of the circuit board 40. The other distal portion 132b of the elastic contact armatures 132 are situated sequentially to the base 131.

According to the first and second embodiments, fixing the circuit board 40 to the case 20 and electrically connecting the ground pattern 44 of the circuit board 40 to the box case 13 of the liquid crystal display 10 may be processed at the same time. The static electricity charged on the liquid crystal display 10 is discharged through the connecting member 30 and the circuit board 40.

Figure 5:
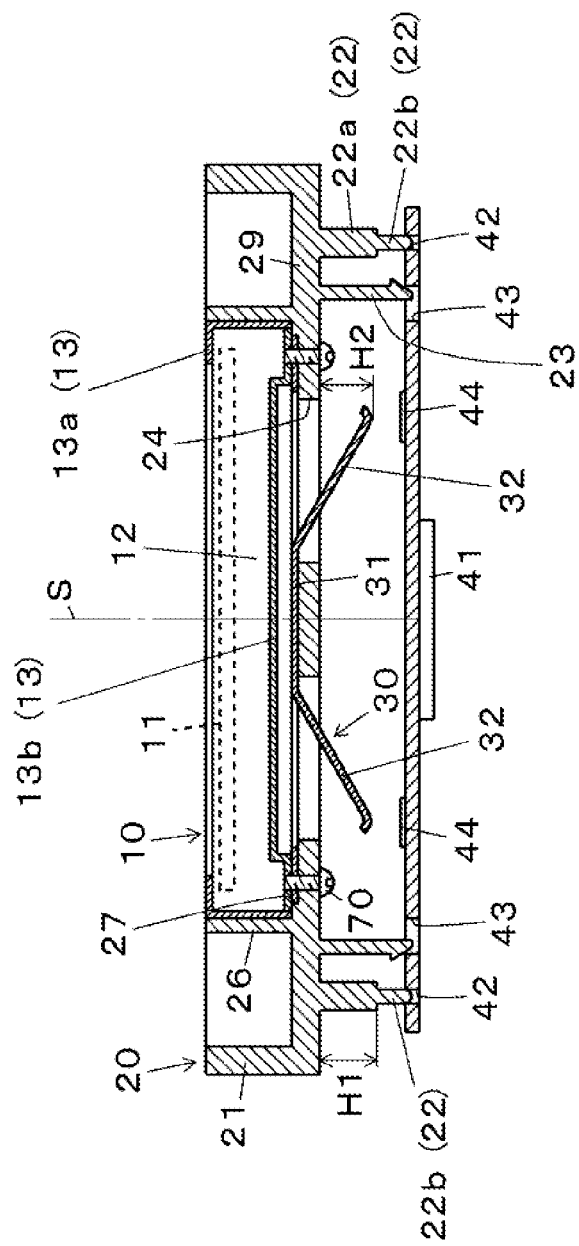
FIG. 5 is a cross-sectional view of a display device according to a first embodiment of the present invention.

The height of the elastic armature 32 (H2) projecting from the back of the bottom wall 29 is desirably shorter than the height of the positioning member 22 (H3) when the circuit board 40 is not fixed to the case 20. As shown in FIG. 5, when positioning the projection part 22b of the positioning member 22 to the hole 42 of the circuit board 40, the elastic contact armatures 32 attaches the circuit board 40 so that the elastic contact armatures 32 does not obstruct an assembly of the circuit board 40.

In other words, it is not desirable that if the height of the elastic contact armature 32 (H2) projecting from the back of the bottom wall 29 is taller than the height of the positioning member 22 when the circuit board 40 is not fixed to the case 20. If the elastic contact armatures 32 attaches the circuit board 40 before positioning the projection part 22b to the hole 42 of the circuit board 40, it may disturb an assembly of the circuit board 40.

In the first and second embodiment, the display was explained as liquid crystal display 10 that is provided with the liquid crystal panel 11. The display may be explained as Organic Electro-Luminescence display that is provided with an Organic Electro-Luminescence panel. In the first and second embodiment, the circuit board 40 was fixed to the case 20 with the elastic locking armature 23, but the circuit board 40 may be fixed to the case 20 with screws.

INDUSTRIAL APPLICABILITY

The present invention may be applied to a display device configures to be excellent in assembling a case to circuit board and conducting a box case to a ground of the circuit board.

REFERENCE SIGNS LIST

10: liquid crystal display
13: box case
20: case
22: positioning member
23: elastic locking armature
24: hole
27: concave portion
30: connecting member
31: base
32: elastic contact armature
40: circuit board
44: ground pattern
70: screw
130: connecting member
131: flange portion
132: elastic contact armature

The invention claimed is:

1. A display device comprising:
    a display having a conductive box case;
    a case accommodating the display;
    a circuit board; and
    a connecting member electrically connecting the conductive box case of the display and a ground of the circuit board, wherein:
    the connecting member includes an elastic contact armature,
    the elastic contact armature is configured to contact with the ground of the circuit board upon the circuit board is fixed to the case,
    the case includes a positioning member configured to position the circuit board and a bottom wall configured to fix the display, and
    a height of the elastic armature projecting from a back of the bottom wall is shorter than a height of the positioning member while the circuit board is not fixed to the case.

2. The display device according to claim 1, wherein the case further comprises an elastic locking armature configured to fix the circuit board.

3. The display device according to claim 1, wherein the case further comprises a through hole in which the elastic contact armature of the connecting member is inserted.

4. A display device comprising:
    a display having a conductive box case;
    a case accommodating the display;
    a circuit board; and
    a connecting member electrically connecting the conductive box case of the display and a ground of the circuit board, so that a static electricity is discharged from the display to the circuit board, wherein:
    the connecting member includes a base configured to contact with the conductive box case and an elastic contact armature configured to contact with the ground of the circuit board upon the circuit board is fixed to the case,
    a fix member fixing the display to the case as the base is to be sandwiched between the conductive box case and the case,
    the case includes a positioning member configured to position the circuit board and a bottom wall configured to fix the display, and
    a height of the elastic armature projecting from a back of the bottom wall is shorter than a height of the positioning member while the circuit board is not fixed to the case.

5. The display device according to claim 4, wherein the case further comprises a concave at which the base of the connecting member is disposed.

* * * * *